(12) United States Patent
Bian et al.

(10) Patent No.: US 8,264,076 B2
(45) Date of Patent: Sep. 11, 2012

(54) POWER TYPE LED

(76) Inventors: Changyou Bian, Hebei (CN); Yuehua Wang, Hebei (CN)

( * ) Notice: Subject to any disclaimer, the term of this patent is extended or adjusted under 35 U.S.C. 154(b) by 102 days.

(21) Appl. No.: 12/811,323

(22) PCT Filed: Apr. 13, 2010

(86) PCT No.: PCT/CN2010/071730
§ 371 (c)(1),
(2), (4) Date: Jun. 30, 2010

(87) PCT Pub. No.: WO2011/109948
PCT Pub. Date: Sep. 15, 2011

(65) Prior Publication Data
US 2011/0284877 A1    Nov. 24, 2011

(30) Foreign Application Priority Data

Mar. 12, 2010  (CN) .......................... 2010 1 0124768
Mar. 12, 2010  (CN) ...................... 2010 2 0132438 U

(51) Int. Cl.
*H01L 23/52*     (2006.01)
*F21S 4/00*      (2006.01)
(52) U.S. Cl. .................... 257/691; 362/249.02; 362/545
(58) Field of Classification Search .................. 257/691, 257/730; 362/249.02, 545, 555
See application file for complete search history.

(56) References Cited

U.S. PATENT DOCUMENTS

| 6,991,351 | B1 * | 1/2006 | Petrick ........................... 362/373 |
| 7,034,470 | B2 * | 4/2006 | Cok et al. ....................... 315/249 |
| 7,407,304 | B2 * | 8/2008 | Tasson et al. ............. 362/249.07 |
| 7,744,250 | B2 * | 6/2010 | Lee et al. ....................... 362/294 |
| 7,794,124 | B2 * | 9/2010 | Hulsey et al. ................. 362/477 |
| D631,567 | S * | 1/2011 | Lodhie .............................. D26/2 |
| 7,995,882 | B2 * | 8/2011 | Wanninger et al. ............. 385/31 |
| 2009/0161381 | A1 * | 6/2009 | Wu ................................. 362/545 |

FOREIGN PATENT DOCUMENTS

CN    101454910 A    6/2009
* cited by examiner

*Primary Examiner* — William D Coleman
(74) *Attorney, Agent, or Firm* — Birch, Stewart, Kolasch & Birch, LLP

(57) ABSTRACT

A group of LED chips mounted on the frame, with an exterior wrapping layer made of a fluorescent substance, wherein said support frame contains a left support and an opposite right support placed at a distance from each other. A group of LED chips is respectively fixed onto a chip-fixing surface of the left support and the right support, with all LED chips serial-connected or parallel-connected with conducting wires. One of the supports is used as the positive pole and the other is used as the negative pole. The middle segment of the left and right supports is wrapped with an insulating layer which combines the left and right supports into an integrated support frame and insulates them from each other. The outer side of the upper part of the two-support frame is covered with a fluorescent layer which can enclose LED chips.

10 Claims, 6 Drawing Sheets

POWER TYPE LED

FIELD OF THE INVENTION

The present invention relates to a light source manufacturing technology, especially to a power-type LED.

BACKGROUND OF THE INVENTION

As a fourth-generation light source, light-emitting diodes (LED) have shown their advantages in a plurality of applied fields such as landscaping, indication, display, backlighting, and special-purpose lighting, and have provided great effects with their high energy efficiency, long service life, and high speed of response. In the history of the lighting technology over the past century, LED has been developing for just several decades. And low-power LED has dominated its application. LED has been widely applied in the field of general lighting due to its features such as easy dynamic control of brightness and color, small dimensions, long service life, absence of infrared and ultraviolet rays in the light beams, and strong directivity of emitted light. However, in order to fully exert the performance competitiveness of LED in the general lighting market, we have to develop power-type light-emitting diodes, improve the light-emitting efficiency, and elevate the uniformity of color and luster.

Most of the power-type LEDs on the current market have a surface-clinging structure, which means that one or several LED chips are fixed to a plane substrate. Since the light-emitting angle of the individual chip will be not greater than 180°, this surface-clinging structure is affected by the angles of chips and the light-blocking effect of the plane substrate. Therefore the light-emitting angle of any LED having this structure will not be greater than 180°. Due to this angle limitation, several LEDs having this structure have to be assembled into a 3-dimensional module having a maximum light-emitting angle greater than 180° before they can be used for general lighting in replacement of incandescent light bulbs. Another 3-D luminescent 360° light source (Chinese Patent Application No.: 200780019635.4, Patent Name: A Semiconductor Light Source with a 3-D Support Used for Illumination of Physical Spaces) can also provide the 3-D luminescent effect. But a coaxial 3-D support is designed for this light source. It matching coaxial 3-D support is made by sheathing a cap having an extended guide pin (positive pole) with a hollow tube (negative pole). An insulating substance is used to separate and fix the negative and positive poles and several chips are fixed to the negative pole. The heat is dissipated only through the negative pole. And the threaded structure on the support cannot closely cling to the nut on the heat sink but only has a small actual contact area with the heat sink. Therefore the support itself has a poor heat dissipating effect which leads to poor lighting effects. In addition it involves a plurality of fittings and a complicated assembling process.

SUMMARY OF THE INVENTION

The purpose of the present invention is to provide a power-type LED which can be made into a semiconductor light source and provides good heat-dissipating effect.

In order to realize the above-mentioned purpose, the following schematic design is adopted in the present invention:

A power-type LED comprising a support frame, a group of LED chips mounted on the frame, and an exterior wrapping layer made of a fluorescent substance; Said support frame consists of a left support and an opposite right support placed at a distance from each other; The upper parts of the left and right supports are semi-cylinders, semi-cones, or semi-rings having multi-direction chip-fixing surfaces; A group of LED chips is respectively fixed onto the chip-fixing surfaces of the left support and the right support. All LED chips are serial-connected or parallel-connected with conducting wires. One of the supports is used as the positive pole and the other is used as the negative pole; The middle segment of the left and right supports is wrapped with an insulating layer which combines the left and right supports into an integrated support frame and insulates them from each other; The outer side of the upper part of the two-support frame is covered with a fluorescent layer which can enclose LED chips.

The upper parts of the left and right supports are semi-cylinders having multi-direction chip-fixing surfaces. The multi-direction chip-fixing surfaces on the semi-cylinders on the supports include at least 1 horizontal chip-fixing surface and a group of chip-fixing surfaces on the outer longitudinal side. The number of LED chips set on the chip-fixing surface on the top of each support is ½ of the total number of LED chips set on the chip-fixing surfaces on the longitudinal side of the support.

The opposite surfaces of the left and right supports are preferably smooth planes and these opposite planes are preferably parallel to each other.

Straight pins or clinched SMD pins are set up in the bottom segments of the two supports as emitter legs.

The material surfaces of the left and right supports are coated with metal layers which prevent the supports from being oxidized.

Both the left and right supports are made of metal or porcelain coated with metal material layers.

Below are the advantages of the present invention:

1. The metal or metal-coated porcelain supports have small thermal resistance. The left and right supports can both conduct electricity and dissipate heat. Compared with the traditional support which has only one pole for heat dissipation, they can greatly improve the heat-dissipating performance and effectively dissipate the heat produced in the operation of the LED. This will extend the service life of the product and make it easier to realize the encapsulation of light-emitting chips with greater power. The power can reach up to 5 W, 8 W, 10 W, or even higher with different semiconductor illuminants.

2. The supports of the power-type LED of the present invention are designed to be compatible with equipment using traditional LEDs in the application of lighting products, and the luminescent effect is equivalent to that of the existing (Chinese Patent Application No.: 200780019635.4) 3-D luminescent 360° light source but its heat dissipating effect is multiplied.

3. The support structure is designed to be extremely convenient for the assembly and maintenance of the product. And under certain conditions, it can save the heat sink that assists heat dissipation, reduce the assembling procedures, and thus greatly reduce the manufacturing cost of the product.

4. LED chips are fixed to the side surfaces and tops of the supports of the power-type LED product, and then directly coated with a fluorescent substance to form a multi-chip integrated large-angle LED, which greatly improves the saturation levels of both light and shape of the near-sphere and the uniformity of both color and luster. It is inferior to the existing 3-D luminescent 360° light source (Chinese Patent Application No.: 200780019635.4) in terms of the saturation levels of both light and shape of the near-sphere and the uniformity of both color and luster, and is comparable to the traditional LED in terms of the uniformity of color and luster.

BRIEF DESCRIPTIONS OF THE DRAWINGS

The present invention will be further detailed as follows with embodiments and attached drawings.

DETAILED DESCRIPTION OF THE INVENTION

Figure 1:
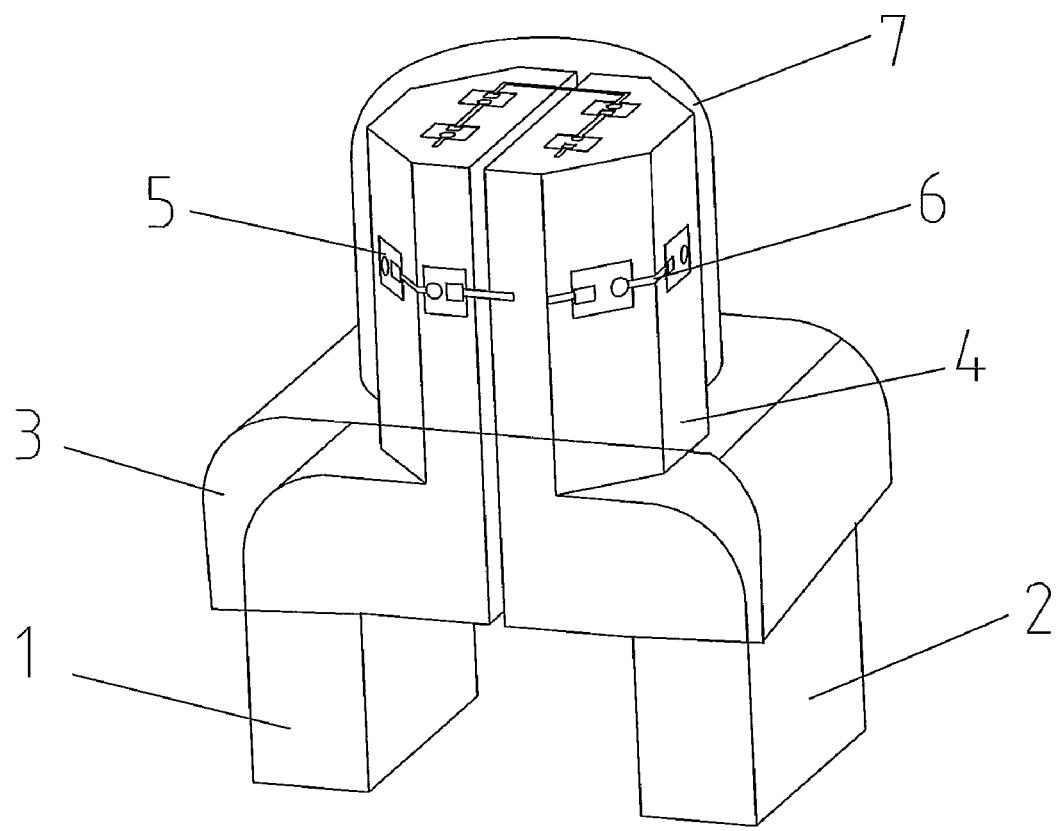
FIG. 1 is a schematic view of the structure of the power-type LED of the present invention.
Figure 2:
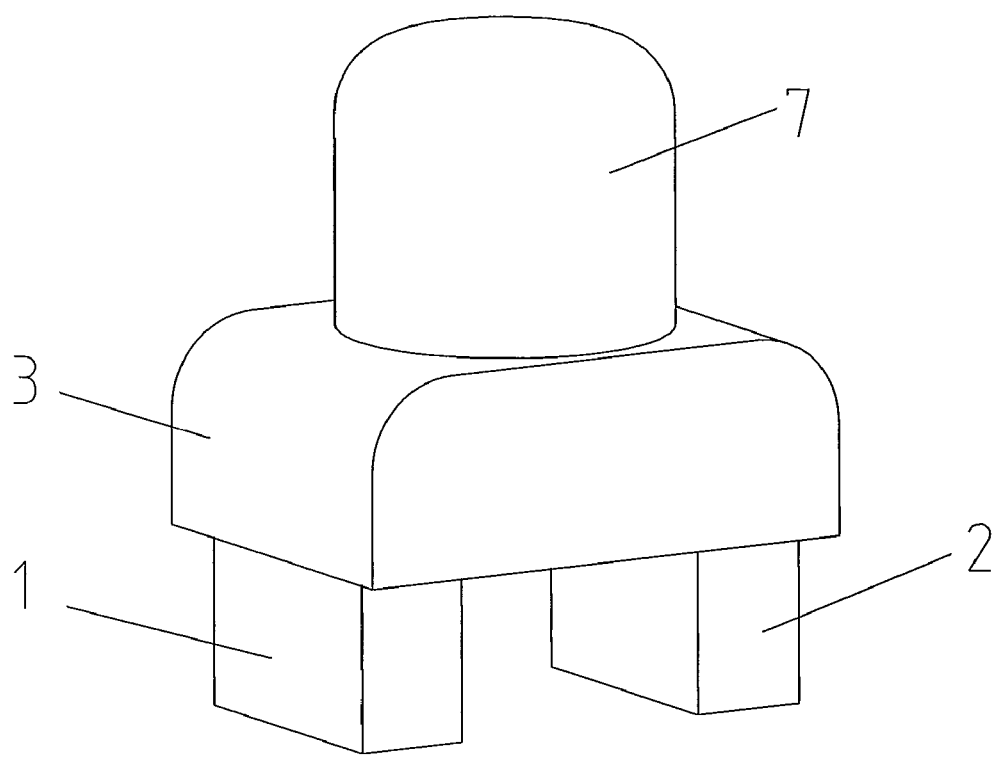
FIG. 2 is a schematic view of the exterior configuration of the power-type LED of the present invention.
Figure 3:
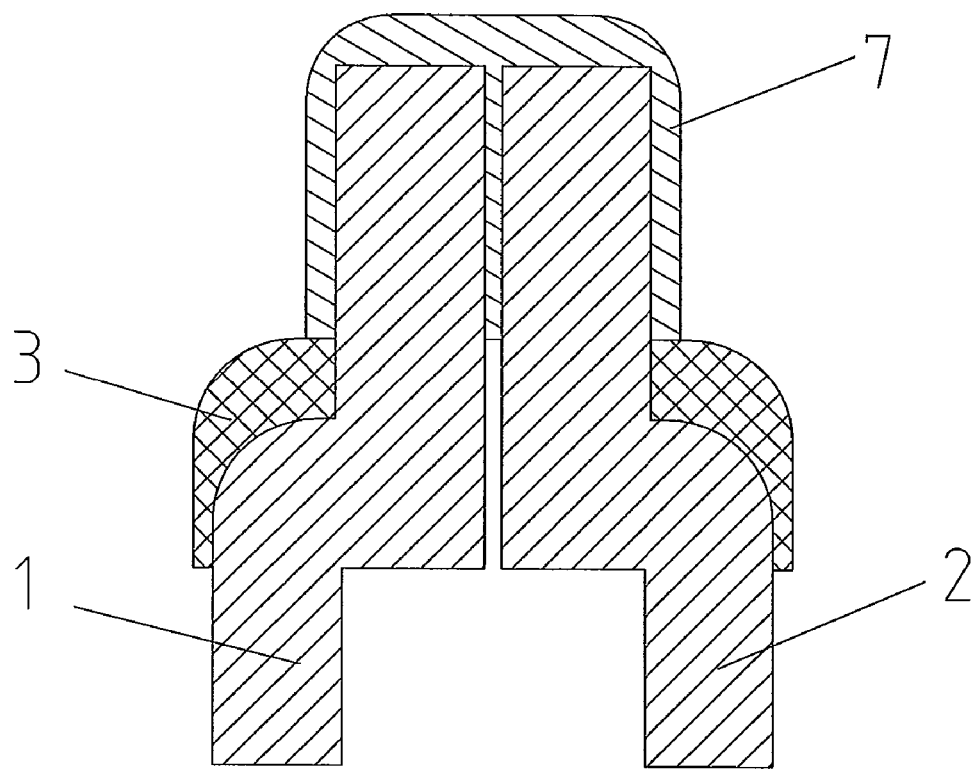
FIG. 3 is a schematic view (profile) of the structure of the power-type LED of the present invention.

As shown in FIG. 1, FIG. 2, and FIG. 3, the power-type LED of the present invention mainly comprises a Left Support 1, a Right Support 2, an Insulating Substance 3 which fixes and connects both supports, LED Chips 5, and Exterior Fluorescent Substance 7.

As shown in FIG. 1, the present invention has broken through the traditional structural pattern by innovatively designing the structure of the support frame as two split structures which are respectively placed on the left and one the right at a distance and insulated to each other, so that Support 1 and Support 2 can be used both as supports and as emitter legs. Both the left and right supports are preferably made of metal or metal-coated porcelain having both electric conductivity and thermal conductivity. The advantages of the material and the configuration result in quick dissipation of heat and can eliminate the necessity of heat sink assisted heat dissipation in existing art. We can remove the heat sink assisting heat dissipation simply by properly adjusting the configuration and dimensions of the left and right supports in the design. This will cut down the assembling procedures, significantly reduce the cost, and greatly facilitate maintenance and repair.

However, heat sink assisted heat dissipation can be added where necessary (e.g. when a greater power is needed).

The material surfaces of the left and right supports shall also be coated with metal layers which prevent the supports from being oxidized.

The upper parts of the left and right supports are semi-cylinders, semi-cones, or semi-rings; The exterior surfaces of these semi-cylinders, semi-cones, or semi-rings are used as Chip-Fixing Surfaces. The shapes and positions of opposite surfaces of Left Support 1 and Right Support 2 are preferably set up in an symmetric manner and are preferably smooth planes parallel to each other, but are not limited to these shapes and positions.

When upper parts of the left and right supports are semi-cylinders having multi-direction chip-fixing surfaces, the opposite surfaces of Left Support 1 and Right Support 2 are preferably smooth planes parallel to each other. The multi-direction chip-fixing surfaces on the semi-cylinders on the supports include at least 1 horizontal chip-fixing surface and a group of chip-fixing surfaces on the longitudinal side. The optimal solution is that: The number of LED chips set on the chip-fixing surface on the top of each support is designed as ½ of the total number of LED chips set on the chip-fixing surfaces on the longitudinal side of the support; Since the LED groups have a series-parallel structure, and LEDs are driven by constant current, each line has the same number of LED chips and the differences between the currents that flow through various lines are small. This will result in the uniformity of color.

Figure 4B:
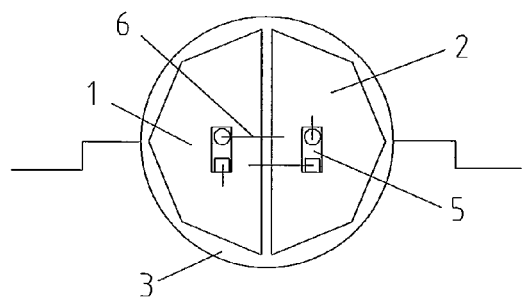
FIG. 4 is the schematic view of an embodiment of the power-type LED of the present invention (no Fluorescent Layer 7; a is the front view, b is the top view, and c is the left view).
Figure 4A:
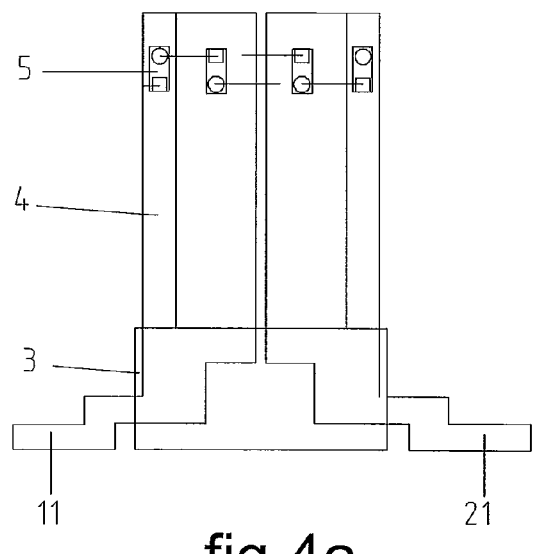
Figure 4C:
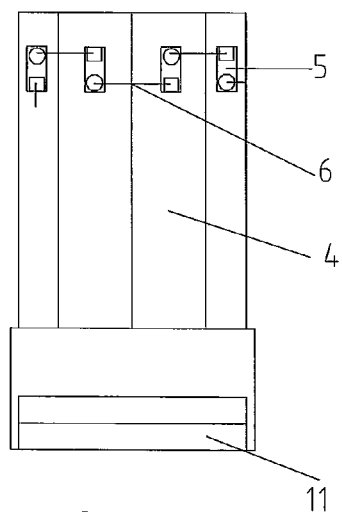
Figure 5B:
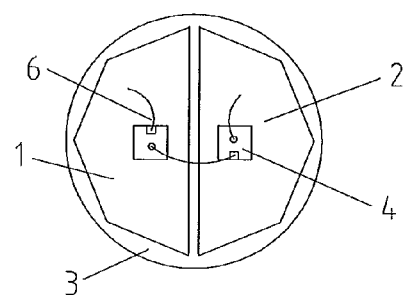
FIG. 5 is the schematic view of another embodiment of the power-type LED of the present invention (no Fluorescent Layer 7; a is the front view, b is the top view, and c is the left view).
Figure 5A:
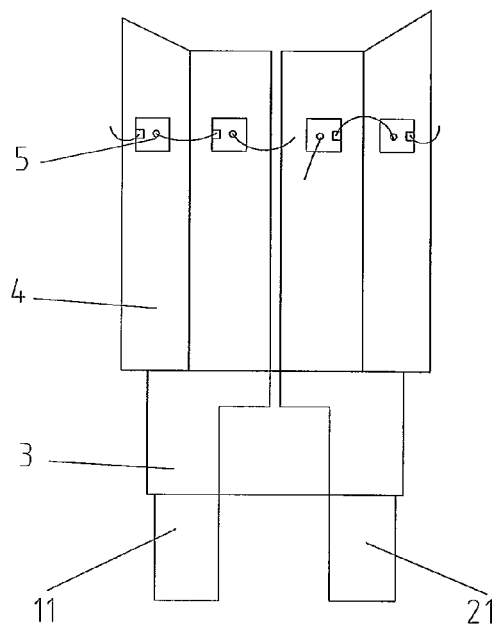
Figure 5C:
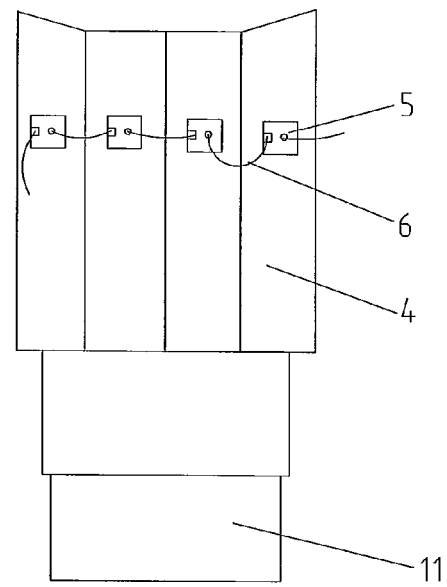

As shown in FIG. 4 and FIG. 5, the group of LED Chips 5 is respectively distributed on the side surfaces and tops of Left Support 1 and Right Support 2. The positive pole (negative pole) of the first LED chip on the side surface of Left Support 1 is electrically connected to Right Support 2 through a Conducting Wire 6. The negative pole (positive pole) of the last LED chip is electrically connected to itself through Conducting Wire 6. All LED Chips 5 are connected to each other with Conducting Wires 6 so that chips on Left Support 1 form a series connection. The negative pole (positive pole) of the last LED chip on the side surface of Right Support 2 is electrically connected to Left Support 1 through Conducting Wire 6. The positive pole (negative pole) of the last LED chip is electrically connected to itself. In this way chips on Right Support 2 form a series connection. A group of LED Chips 5 is respectively distributed on the tops of Left Support 1 and Right Support 2. The negative pole (positive pole) of the first chip on the top of Left Support 1 is electrically connected to itself through Conducting Wire 6. The positive pole (negative pole) of the first chip on the top of Right Support 2 is electrically connected to itself through Conducting Wire 6. All chips on the tops of the left and right supports are connected to each other with Conducting Wires 6 to form a series connection. This will form a series-parallel structure of all LED chips on the entire supports. Since a series-parallel structure is sued for the electric connection of LED chips on the supports, the product will not lead to very high current or voltage when used to make LEDs with hither power. And it will be easier to design high-efficiency driving power supplies for its downstream products in application. And since LEDs are preferably driven by constant current, the series-parallel structure requires that all series lines have the same voltage. Therefore the number of LED chips set on the crystal-fixing surface on the top of each support is ½ of the total number of LED chips set on the crystal-fixing surfaces on the longitudinal side of the support, so that all series lines have the same voltage. The optimal design is as follows: Four (or two) LED Chips 5 are fixed to the side surfaces of the left and right supports and two (or one) LED chips are fixed on the tops so that the chips on the entire supports form a 4-series-4-parallel (or 2-series-3-parallel) connection. If the series lines do not have the same voltage, the product will have poor color uniformity and the LED chips will not provide the greatest efficiency.

Figure 6B:
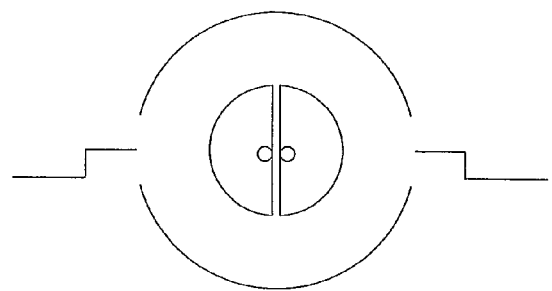
FIG. 6 is the schematic view of a further embodiment of the power-type LED of the present invention (no Fluorescent Layer 7; a is the front view, b is the top view, and c is the left view).
Figure 6A:
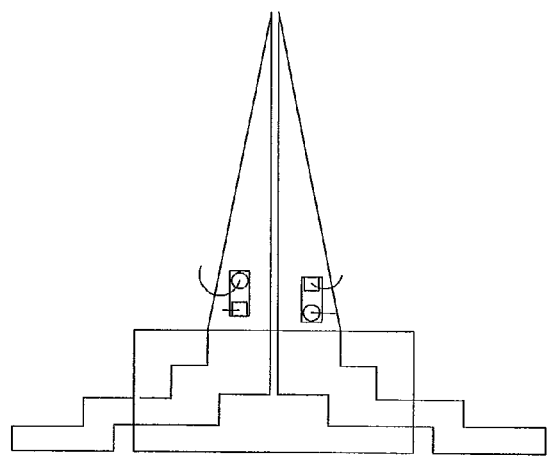
Figure 6C:
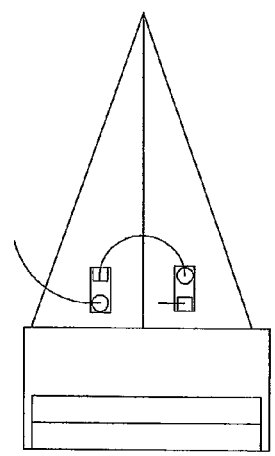

FIG. 6 shows another embodiment of the present invention. The upper parts of the left and right supports are semi-cones. Said semi-cones do not need chip-fixing surfaces on top. Since their tops do not have any blocking effect, they will not affect the emitting of light from the side surfaces of the supports or cause uneven light or color.

The upper parts of the left and right supports can also be designed as semi-rings in the present invention. The opposite surfaces of both the left and right supports are preferably smooth transitional surfaces. A substance that facilitates heat dissipation can be added into the hollow spaces enclosed by the left and right semi-rings of the supports (e.g.: a heat pipe or any other highly efficient heat dissipating substance) in order to achieve extremely good heat dissipating effect and enable the fabrication of an LED having greater power.

The semi-cylinders, semi-cones, or semi-rings on the tops of the left and right supports can be further designed as hollow structures. A substance that facilitates heat dissipation can also be added into the hollow space.

The middle and lower parts of the left and right supports can be made up of irregular shapes. In the present embodiment, the bend can either be beveled into an arc or made into a right angle or other shapes. The bottom of the bend is jointed with the lower part of the support. This part can be a conductor of any shape. A polar leg can be led out of the bottom or lower lateral part of the lower part of the support.

The left and right supports can have the same structure or different structures. They are preferably set up in a symmetric manner but can also be asymmetric.

A group of LED Chips 5 (1 is enough but the quantity is not limited) is respectively fixed to the chip-fixing surfaces of the left and right supports. The negative (positive) poles of the LED Chips are electrically connected to the positive (negative) poles through Conducting Wires 6. All LED chips are series-connected or parallel-connected through wires. One of the supports is used as the positive polar leg and the other is used as the negative polar leg.

The middle segment of the left and right supports is wrapped with an insulating layer which combines the left and right supports into an integrated structure and insulates them from each other; The insulating substance can fix the left and right supports into an integrated support structure. When connected to each other, both supports are preferably placed parallel to each other. The whole or a part of the clearance between them is filled with Insulating Substance 3. The led-out polar legs are extended from the bottoms or side surfaces of both supports beneath Insulating Substance 3. The bottom legs of both supports can be Straight Pines 11 and 21 (FIG. 5) or SMD Pins 11 and 21 (FIG. 4).

The upper parts of the combined supports are covered with a fluorescent layer which can enclose LED chips.

The LED chips can emit light in all angles. Therefore the Exterior Fluorescent Substance 7 is designed to protect LED Chips 5 inside the supports. The light emitted from Conducting Wires 6 and LED Chips 5 is mixed into white light. Through different combinations of the positions of LED Chips 5 and the Exterior Fluorescent Substance 7, the present invention achieves a light-emitting angle of 270° (horizontal)/270° (vertical) or lower than 270° of the entire new-style power-type LED; The light is shaped like a ⅔ near-sphere. We can both assembly several units or directly use one single unit in a lighting production.

All the illustrated embodiments above can have several variations without deviating from the scope of the present invention. Therefore the structures included in the specification and shown in the drawings have been set forth only for the purposes of examples and should not be taken as limiting the scope of protection of the patent application of the invention.

What is claimed is:

1. A power-type LED comprising a support frame and a group of LED chips mounted on the support frame, wherein
said support frame consists of a left support and an opposite right support placed at a distance from each other;
the upper parts of the left and right supports being semi-cylinders, semi-cones, or semi-rings having multi-direction chip-fixing surfaces;
a group of LED chips respectively fixed onto the chip-fixing surfaces of the left support and the right support, all LED chips being serial-connected or parallel-connected with conducting wires, one of the supports being used as a positive pole and the other being used as a negative pole;
a middle segment of the left and right supports being wrapped with an insulating layer which combines the left and right supports into an integrated two-support frame and insulates them from each other;
the outer side of the upper part of the two-support frame being covered with a fluorescent wrapping layer which can enclose LED chips.

2. The power-type LED according to claim 1, wherein the upper parts of the left and right supports are semi-cylinders having multi-direction chip-fixing surfaces, the multi-direction chip-fixing surfaces on the semi-cylinders on the supports including at least 1 horizontal chip-fixing surface and a group of chip-fixing surfaces on the outer, longitudinal side.

3. The power-type LED according to claim 2, wherein the number of LED chips set on the chip-fixing surface on the top of each support is ½ of the total number of LED chips set on the chip-fixing surfaces on the longitudinal side of the support.

4. The power-type LED according to claim 1, wherein the opposite surfaces of the left and right supports are smooth planes and these opposite planes are parallel to each other.

5. The power-type LED according to claim 1, wherein the opposite surfaces of the left and right supports are smooth transitional surfaces.

6. The power-type LED according to claim 1, wherein straight pins or clinched SMD pins are set up in the bottom segments of the two supports as emitter legs.

7. The power-type LED according to claim 1, wherein the material surfaces of the left and right supports are coated with metal layers which prevent the supports from being oxidized.

8. The power-type LED according to claim 1, wherein both the left and right supports are made of metal or porcelain coated with metal material layers.

9. The power-type LED according to claim 1, wherein the semi-cylinders, semi-cones, or semi-rings on the tops of the left and right supports are hollow structures, and a substance that facilitates heat dissipation is placed in the hollow spaces of the structure.

10. The power-type LED according to claim 1, wherein the upper parts of the left and right supports are semi-rings, and a substance that facilitates heat dissipation is placed in the hollow spaces enclosed by the left and right semi-rings.

\* \* \* \* \*